United States Patent [19]
Okada

[11] Patent Number: 5,146,113
[45] Date of Patent: Sep. 8, 1992

[54] SEMICONDUCTOR INTEGRATED CIRCUIT HAVING AN ORIENTED RESISTANCE PATTERN

[75] Inventor: Masaki Okada, Nagoya, Japan

[73] Assignees: Fujitsu Limited, Kanagawa; Fujitsu VLSI Limited, Aichi, both of Japan

[21] Appl. No.: 666,765

[22] Filed: Mar. 8, 1991

[30] Foreign Application Priority Data

Mar. 9, 1990 [JP] Japan ................................ 2-58924

[51] Int. Cl.$^5$ ............................................ H01L 25/00
[52] U.S. Cl. ................................ 307/303.1; 307/303.2; 357/51
[58] Field of Search ................ 307/303, 303.1, 303.2, 307/299.1; 357/51, 48, 40

[56] References Cited

U.S. PATENT DOCUMENTS

| | | | |
|---|---|---|---|
| 4,403,240 | 9/1983 | Seki | 357/48 |
| 4,413,271 | 11/1983 | Gontowski | 357/48 |
| 4,426,658 | 1/1984 | Gontowski | 357/51 |
| 4,688,065 | 8/1987 | Kinoshita | 357/51 |
| 4,724,356 | 2/1988 | Daehler | 357/51 |
| 4,819,046 | 4/1989 | Misu | 357/51 |
| 4,862,241 | 8/1989 | Ashida | 357/51 |
| 4,893,157 | 1/1990 | Miyazawa | 357/23.13 |

Primary Examiner—Eugene R. Laroche
Assistant Examiner—A. Zarabian
Attorney, Agent, or Firm—Nikaido, Marmelstein, Murray & Oram

[57] ABSTRACT

An integrated circuit includes a circuit chip, one or more circuits provided on the circuit chip, an input/output circuit provided on the circuit chip in electrical connection to the one or more circuits for transmitting and/or receiving an information signal to and from an external circuit outside the circuit chip, a plurality of resistance areas provided on the circuit chip for electrical connnection therewith for providing a predetermined input and/or output impedance of the integrated circuit, and a plurality of connection pads provided on the circuit chip in correspondence to the plurality of resistance areas for electrical connection therewith, for electrical connection to the external circuit. The plurality of resistance areas include a plurality of elongated resistance strips connected in series and extending parallel with each other, wherein each elongated resistance strip in each resistance area extends on the major surface of the circuit chip in a predetermined direction.

6 Claims, 8 Drawing Sheets

FIG. I

PRIOR ART

SEMICONDUCTOR INTEGRATED CIRCUIT HAVING AN ORIENTED RESISTANCE PATTERN

BACKGROUND OF THE INVENTION

The present invention relates in general to semiconductor devices, particularly to the layout of a semiconductor integrated circuit for realizing reliable operational characteristics.

In the semiconductor integrated circuits, it is generally required that the integrated circuit has input and output circuits that have predetermined, standardized input and output characteristics. For example, the integrated circuits that are used for telecommunications according to the CCITT protocols such as the CCITT v.28, etc., are required to have a standardized impedance or resistance in the input and output signal paths. Generally, there are a number of input or output channels in such integrated circuits, and associated therewith, there are a number of input or output buffer circuits provided in the integrated circuit. With the decreasing size of the integrated circuit chip, these input/output buffer circuits have to be disposed along the periphery of the circuit chip to surround the chip. Each of these input or output buffer circuits includes one or more resistors of which value is determined according to the telecommunication protocol or other industrial standard. Particularly, there are occasions wherein the standard protocol has to be observed exactly. In other words, there are cases wherein the resistors in the input and output buffer circuits are required to have an exact resistance value.

FIG. 1 shows an example of the input buffer circuit, while FIG. 2 shows an example of the output buffer circuit.

Referring to FIG. 1, there is provided an input connection pad 4 of an LSI chip on which a lead wire carrying an input signal is bonded, and the input signal is supplied to an inverter part including a P-channel MOS transistor 5 and an N-channel MOS transistor 6 via a resistor part R including resistors R1 and R2 and a clamping part including diodes D1 and D2. The clamping part clamps the signal to the transistors 5 and 6 and protects the same against surge or other excessive rising of input signal voltage. The signal is subsequently sent to a processing circuit provided inside the LSI chip. The resistor part R provides the required input impedance, and for this purpose, the resistors R1 and R2 are required to have values matching the designed value.

FIG. 2 shows an example of the output circuit.

Referring to FIG. 2, there is provided an inverter circuit including a P-channel MOS transistor 5' and an N-channel MOS transistor 6', and an output signal of a processing circuit inside the LSI chip is supplied to the inverter circuit. In the inverter circuit, a voltage divider including a resistor R3 and a resistor R4 is interposed between the source of the MOS transistor 5' and the drain of the MOS transistor 6'. The voltage divider has a center node that is connected to a connection pad 4'. In this circuit, too, it is desired that the resisters R3 and R4 have respective values exactly adjusted to the designed values.

FIG. 3 shows the layout of the input/output part of a conventional LSI chip in the plan view, wherein the drawing shows only the lower right corner of a chip 1 that includes the output buffer circuit of FIG. 2. In the description hereinafter, the edge of the chip shown at the bottom in the drawing will be referred to as the bottom edge for the sake of convenience, although this edge would not be at the bottom when the chip is set horizontal for the actual use. Similarly, the direction extending vertically in the drawing will be referred to as the vertical direction of the chip for the sake of convenience, although this direction should be horizontal in the actual setting of the chip.

Referring to FIG. 3, the chip 1 has a bottom edge along which the transistor 5' and the transistor 6' are aligned in the vertical direction with the connection pad 4 intervening therebetween. The resistor R3 is provided between the transistor 5' and the connection pad 4, while the resistor R4 is provided between the transistor 6' and the connection pad 4. Further, along the right edge of the chip 1, there is provided the transistors 5' and 6' with the intervening connection pad 4' such that the transistor 5', the connection pad 4' and the transistor 6' are aligned in the horizontal direction.

In order to achieve the desired resistance, the resistors R3 and R4 are generally configured to have a zig-zag pattern including a number of elongated resistance strips connected in series. In designing the layout of such resistors, it has been practiced that the elongated resistance strips forming the resistors at the bottom edge of the chip extend in the vertical direction while the resistors provided along the right edge have the elongated resistance strips extending in the horizontal direction.

As already noted, there occurs frequently the case wherein each input or output buffer circuit provided on the chip should have an identical input/output characteristics, including the input or output resistance, wherever it may be located on the chip. Thus, there arises a case in which the output buffer circuit of FIG. 3 at the bottom edge of the chip 1 should have a resistance value for the resistors R3 and R4 that is identical with the resistance value of the resistors R3 and R4 of the output buffer circuit provided at the right edge of the chip 1.

The formation of such a resistance pattern is of course possible, provided that the patterning for forming the resistance strips is controlled exactly. In the actual fabrication process of LSIs, however, there often arises a case in which the pattern is distorted and the desired size of the pattern is different in the two perpendicular directions on the surface of the chip. For example, there arises a case wherein a pattern, that is formed to have a predetermined size, actually has various sizes in various elongating directions.

FIGS. 4(A)–4(D) show an example of such deformation of the pattern.

Referring to the drawings, FIG. 4(A) shows a resistor pattern RX with the predetermined, designed size in the X- and Y-directions. In the illustrated example, the pattern RX has a longitudinal size in the X-direction of 50 $\mu$m and a lateral size in the Y-direction of 20 $\mu$m. FIG. 4(B) shows the same pattern RX formed on the actual wafer by the photolithographic patterning process. In the formed pattern, designated as RX1 in the drawing, the longitudinal edge in the X-direction is increased by about 10%, while there is an increase in the lateral size of about 5% in the Y-direction. Thus, the pattern RX1 has the longitudinal size of 55 $\mu$m in the X-direction and the lateral size of 21 $\mu$m in the Y-direction. Although the reason of such a distortion of the pattern is not completely understood, it is believed that these distortions occur from various causes such as the non-flat, curved wafer surface, distortion of the photolithographic mask, error as the time of fabrication of the mask, and the like. When such a distortion occurs, the resistance pattern RX1 of FIG. 4(B) takes a resistance value of $r \times 55\ \mu m/21\ \mu m \approx 2.62 \times r$ ohms, where r represents the surface resistance per unit area.

FIGS. 4(C) and 4(D) show the example of distortion of a vertically elongated pattern RY, wherein the pattern RY represents the as-designed pattern while the pattern RY1 represents the actually formed pattern.

Referring to FIGS. 4(C) and 4(D), the lateral edge extending in the X-direction increases from 20 μm to 22 μm and the longitudinal edge extending in the Y-direction increases from 50 μm to 52.5 μm due to the distortion that increases the size of the pattern in the X-direction by 10% and in the Y-direction by 5%. In this case, the actual pattern RY1 shows a resistance value of $r \times 52.5\ \mu m/22\ \mu m \approx 2.37 \times r$ ohms.

The foregoing examples clearly show that the resistance value may be changed in the actual pattern, depending on the elongating direction of the patterned resistance strip.

When the foregoing problem of distortion of the pattern occurs in the layout pattern of FIG. 3, it will be easily understood that the value of the resistance may differ in the resistance R3 or R4, depending on whether they are provided along the right edge of the chip or along the bottom edge of the chip. When such a difference in the resistance value exists, on the other hand, the output buffer circuit of FIG. 2 would have different output resistances depending on the location on the chip where the circuit is provided. A similar problem arises also in the input buffer circuit of FIG. 1.

SUMMARY OF THE INVENTION

Accordingly, it is a general object of the present invention to provide a novel and useful semiconductor integrated circuit wherein the foregoing problems are eliminated.

Another and more specific object of the present invention is to provide a semiconductor integrated circuit wherein input/output buffer circuits have an identical characteristic irrespective of the location on the semiconductor integrated circuit chip wherein the input/output buffer circuit is provided.

Another object of the present invention is to provide a semiconductor integrated circuit having a plurality of input/output circuits for interfacing outputting and inputting of information signals to and from the semiconductor integrated circuit, wherein the input/output circuits are grouped into a first circuit group wherein the circuits therein are aligned in a first direction on the chip of the integrated circuit and a second circuit group wherein the circuits therein are aligned in a second direction different from the first direction, each circuit of the first and second group having an identical characteristic and construction and including one or more resistors that extend in a predetermined, single direction on the chip. According to the present invention, the problem of variation in the resistance value of the resistors depending on the location where the input/output circuit is provided, is eliminated by setting the elongating direction of the resistance strips forming the resistors in the predetermined direction. Thereby, the characteristics of the input/output circuit is controlled exactly to comply with the industrial standard such as the CCITT recommendation or RS232C standard.

Other objects and further features of the present invention will become apparent from the following detailed description when read in conjunction with the attached drawings.

DETAILED DESCRIPTION

Figure 5:
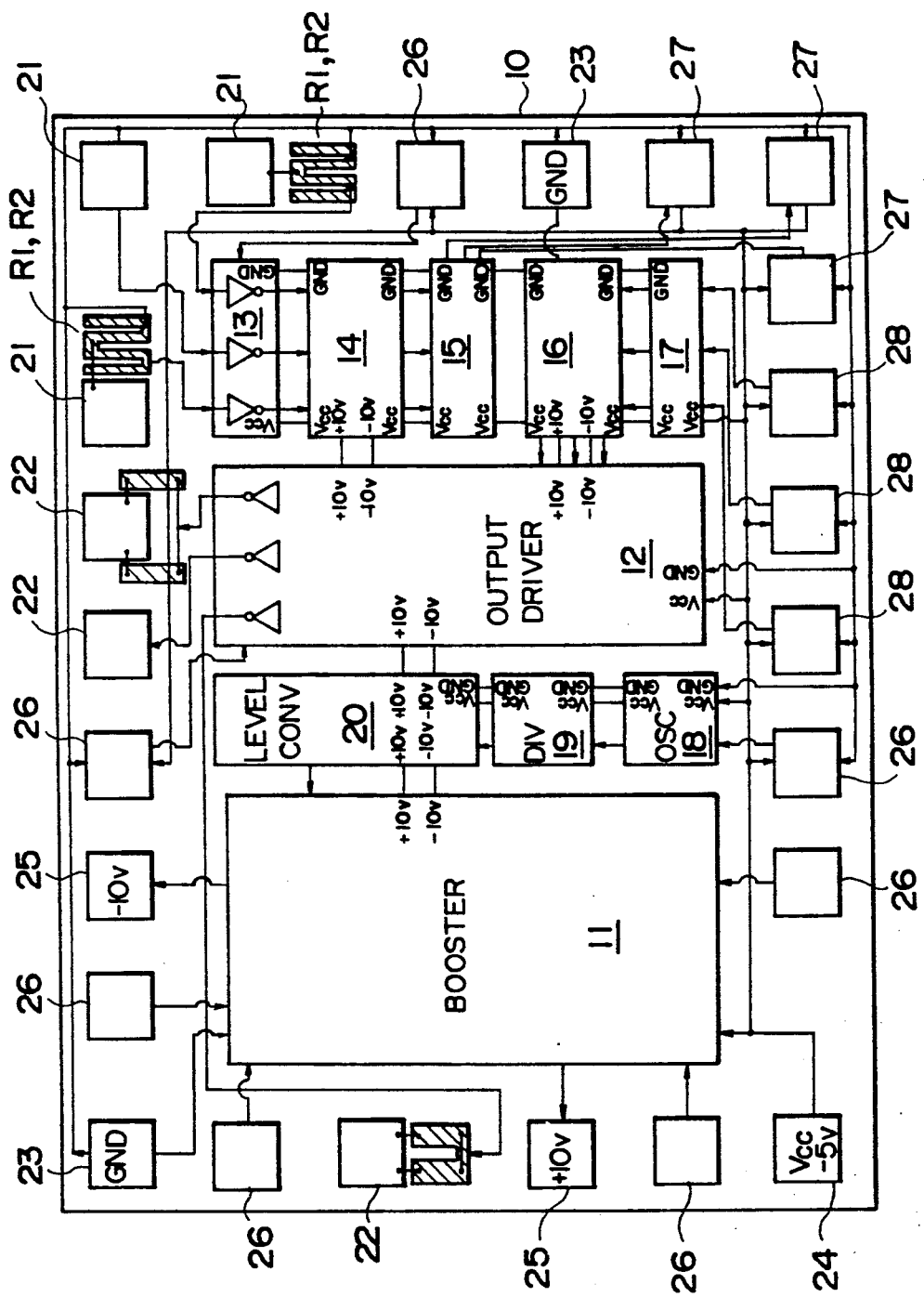
FIG. 5 is a plan view showing the layout of an LSI according to a first embodiment of the present invention.

FIG. 5 shows the overall layout of the LSI according to a first embodiment of the present invention.

Figure 1:
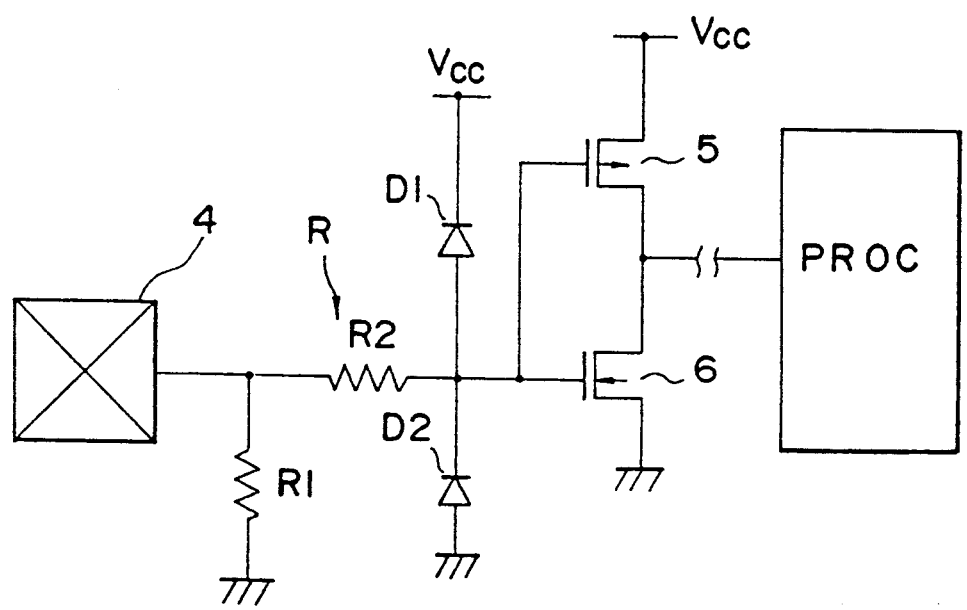
FIG. 1 is a circuit diagram showing the construction of a conventional input circuit of an LSI.
Figure 2:
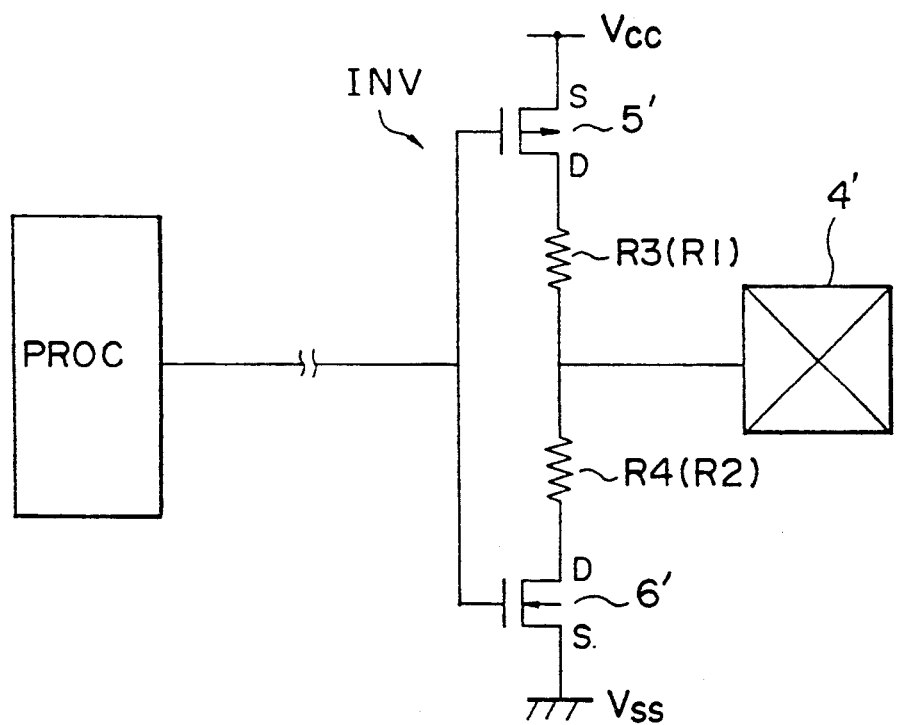
FIG. 2 is a circuit diagram showing the construction of a conventional output circuit of an LSI.

Referring to FIG. 5, the LSI forms a driver/receiver circuit in compliance with the RS232C standard, and comprises a chip 10 on which a number of circuits such as a booster 11, an output driver circuit 12, a receiver input buffer circuit 13, a receiver level converter 14, a receiver output circuit 15, a driver level converter 16, a driver input circuit 17, an oscillator 18, a frequency divider 19, a level converter 20 and the like, are provided, wherein the receiver input buffer circuit 13 corresponds to the input buffer circuit of FIG. 1 connected to an external transmission line for receiving an information signal, and the driver output circuit 12 corresponds to the output buffer circuit of FIG. 2 connected to an external transmission line for transmitting an information signal. The input buffer circuit 13, the receiver level converter 14 and the receiver output circuit 15 form a receiver part of the LSI, while the driver level converter 16, the driver input circuit 17 and the output driver 12 form a driver part of the LSI. The booster 11, oscillator 18 and the level converter 20 form various frequency signals and voltage signals used in the receiver part and the driver part. As the construction of these circuits are well known, further description about the construction and operation thereof will be omitted.

Along the periphery of the chip 10, there are provided a number of connection pads including a pad 21 corresponding to the input pad 4 of FIG. 1 and connected to the receiver input buffer circuit 13, a pad 22 corresponding to the output pad 4' of FIG. 2 and connected to the output driver circuit 12, a pad 23 for the ground connection of the circuits on the chip 10, a pad 24 for receiving a power voltage from an external power source, a pad 25 for supplying a predetermined voltage produced by the booster 11 for external use, a pad 26 for receiving various external control signals for the control of the circuits on the chip 10, a pad 27 for outputting the output signal of the receiver part, and a pad 28 for inputting the input signal to the driver part. The LSI includes three input and output channels and thus, there are three sets of pads 21, 22, 27 and 28.

Similar to the conventional example, each input pad 21 is accompanied by a resistor part including the resistors R1 and R2, and each output pad 22 is accompanied by a resistor part including the resistors R3 and R4. As can be seen in FIG. 5, there is one input pad 21 for the first channel along the upper edge of the chip 10 while there is one, other input pad 21 for the second channel along the right edge of the chip 10. Further, there is still other pad 21 at the upper right corner of the chip 10 in correspondence to the third channel. Similarly, there are two output pads 22 along the upper edge of the chip 10 for the first and second channels and another output pad 22 at the left edge of the chip in correspondence to the third channel. Again, the phrase "upper edge" and "bottom edge" of the chip 10 used herein represent the edges that are shown at the top and bottom of FIG. 5 respectively for the sake of convenience and do not represent the actual geometrical relationship when the chip is used. It should be noted that the LSI chip 10 of FIG. 5 has the previous problem of varying resistance value of the resistors R1, R2, R3 and R4 when the resistance strips forming these resistors are formed according to the conventionally practiced layout.

Figure 6:
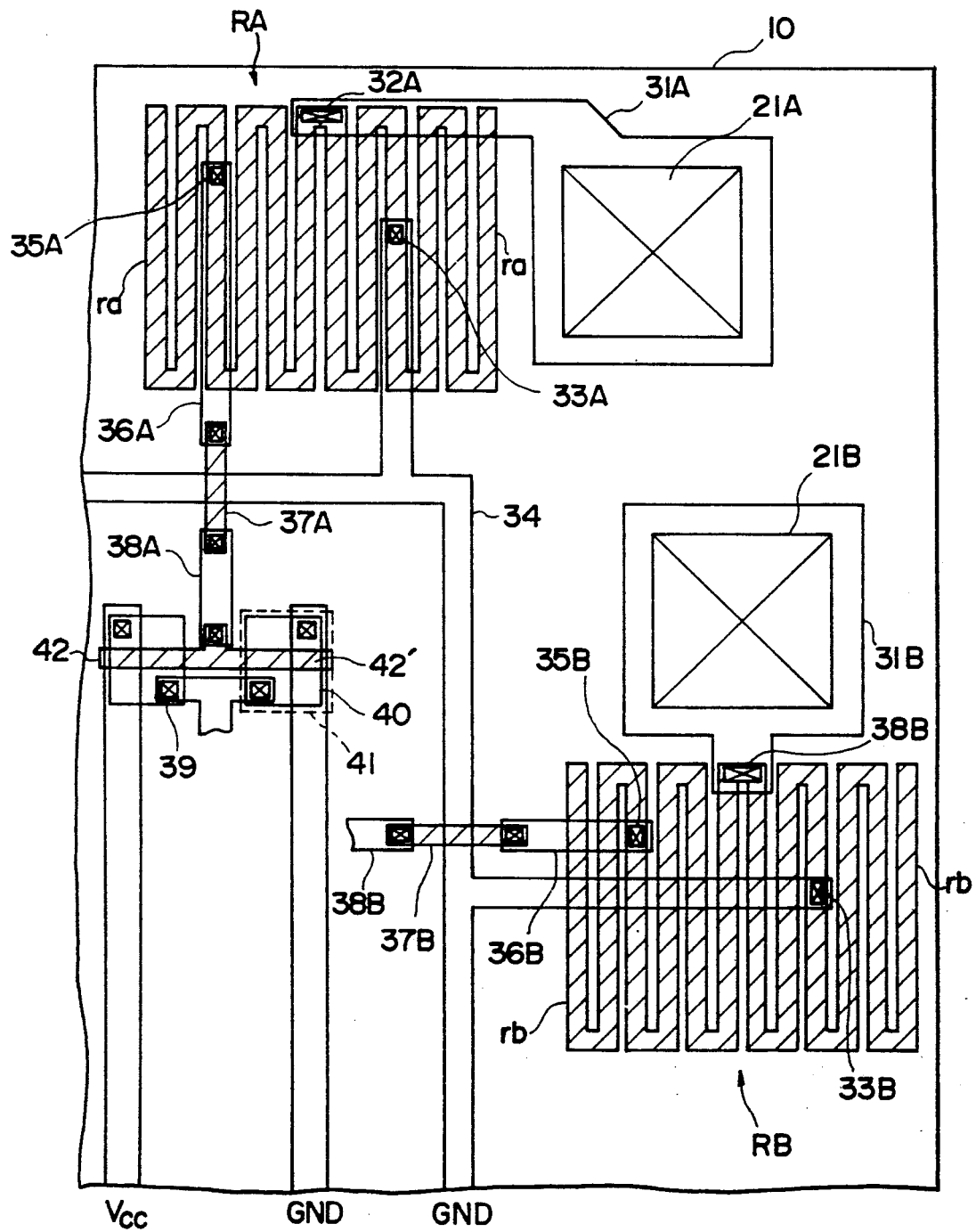
FIG. 6 is a plan view showing a part of the layout of FIG. 5 in an enlarged scale.

FIG. 6 shows the upper right corner of the chip 10 according to the first embodiment with an enlarged scale.

Referring to FIG. 6, there is provided a polysilicon resistance pattern RA at the top edge of the chip 10 in electric connection to a pad 21A of aluminum via an aluminum pattern 31A. It should be noted that the pad 21A corresponds to the pad 21 of FIG. 5 located at the upper right corner of the chip 10 and is used for receiving the information signal corresponding to one of the three channels. The aluminum pattern 31A is connected to the polysilicon resistance pattern RA at a contact hole 32A.

The polysilicon resistance pattern RA comprises a number of polysilicon resistance strips ra extending parallel with each other in the vertical direction, wherein the polysilicon strips ra are connected in series to form the resistors R1 and R2 of FIG. 1. More specifically, there is provided another contact hole 33A on the polysilicon pattern RA through which the polysilicon pattern RA is connected to an aluminum ground pattern 34. Thus, the portion of the polysilicon pattern between the contact hole 32A and the contact hole 33A forms the resistor R1. The aluminum ground pattern 34 is connected to the ground pad 23 nearby.

Further, there is provided another contact hole 35A on the pattern RA such that the pattern RA is connected to a polysilicon gate 42 of a P-channel MOS transistor 39A corresponding to the transistor 5 of FIG. 1 and a polysilicon gate 42' of a N-channel MOS transistor 40A corresponding to the transistor 6 of FIG. 1, via an aluminum pattern 36A, a polysilicon pattern 37A and another aluminum pattern 38A. Thereby, the part of the polysilicon pattern RA between the contact hole 32A and the contact hole 35A form the resistor R2 of FIG. 1. In FIG. 5, it should be noted that the transistor 39A is formed directly on the chip 10 acting as the substrate while the transistor 40 is formed in a p-type well 41 formed inside the chip 10. The polysilicon gate 42 of the transistor 39 and the polysilicon gate 42' of the transistor 40 are formed from a single polysilicon pattern as illustrated.

A similar layout pattern is formed at the right edge of the chip 10. Referring to FIG. 6, there is provided an aluminum pad 21B for the channel different from the channel that uses the pad 21A, and the pad 21B is connected to a polysilicon pattern RB corresponding to the pattern RA via an aluminum pattern 31B at a contact hole 32B.

It should be noted that the polysilicon pattern RB is formed at a location below the pad 21B in the illustration of FIG. 6, and has a layout exactly identical with the layout of the polysilicon pattern RA, including the orientation of the pattern on the surface of the chip. More specifically, the polysilicon pattern RB comprises a number of parallel polysilicon resistance strips rb that extend parallel with each other in the vertical direction and connected in series. The pattern RB is connected to the aluminum ground pattern 34 at a contact hole 33B. Thereby, the resistor R1 of FIG. 1 is formed between the contact hole 32B and the contact hole 33B similar to the case of the pattern RA. Further, there is another contact hole 35B that is connected to the gate of the transistors corresponding to the transistors 5 and 6 not illustrated, via an aluminum pattern 36B corresponding to the pattern 36A, a polysilicon pattern 37B corresponding to the pattern 37A, and a polysilicon pattern 38B corresponding to the pattern 38A. Thereby, another channel for the input buffer circuit is formed.

It should be noted again that the polysilicon resistance strips rb that form the polysilicon pattern RB extend in the vertical direction similar to the polysilicon resistance strips ra forming the polysilicon pattern RA. Thereby, the patterns RA and RB have an identical resistance value even when the pattern RA is formed at the top edge of the chip 10 and the pattern RB is formed at the side edge of the chip 10. Thus, the problem of the resistance value of the polysilicon resistors deviating from the designed value depending on the location of the resistors on the chip pertinent to the conventional layout, is eliminated.

Figure 7:
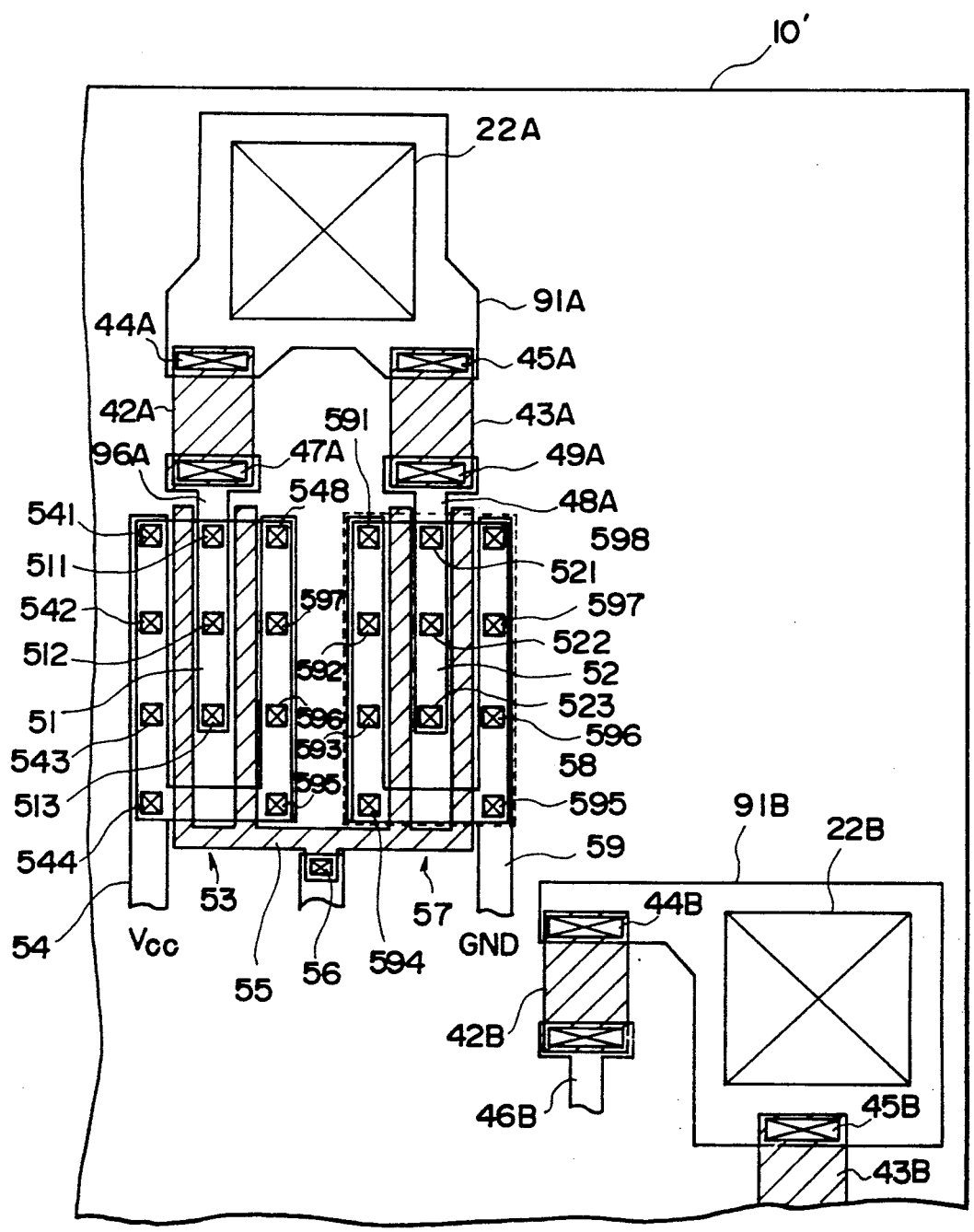
FIG. 7 is a plan view showing another part of the layout of FIG. 5 according to a second embodiment in an enlarged scale.

FIG. 7 shows the layout pattern of the output buffer circuit of FIG. 2 in accordance with a second embodiment of the present invention. The present embodiment uses an LSI chip 10' that is similar to the chip 10 and only a part of the chip 10' is shown in FIG. 7. The difference between the chip 10' and chip 10 is not essential and the layout of FIG. 7 may be understood as a part of the chip 10 of FIG. 5.

Referring to FIG. 7, there is provided an aluminum connection pad 22A at the top edge of the chip 10', and polysilicon resistance strips 42A and 42B are provided on the chip 10' to extend in the vertical direction in connection to the pad 22A via respective contact holes 44A and 45A and an aluminum pattern 41A that makes a direct contact to the pad 22A on the surface of the chip 10'. The resistance strips 42A and 43A, in turn, are connected to aluminum patterns 46A and 48A extending in the downward direction at respective contact holes 47A and 49A, and the aluminum strips 46A and 48A extend in the downward direction from the contact holes 47A and 49A respectively. Thereby, the aluminum strip 46A makes a contact with a diffusion region 51 formed in the chip 10' as the drain of a P-channel MOS transistor 53 corresponding to the transistor 5' of FIG. 2, via contact holes 511, 512 and 513. Similarly, the aluminum strip 48A makes a contact with a diffusion region 52 in the chip 10' as the drain of an N-channel MOS transistor 57 corresponding to the transistor 6' of FIG. 2, via contact holes 521, 522 and 523. It should be noted that the transistor 57 is formed inside a p-type well 58 formed in the chip 10'.

At both sides of each channel region formed in the vertical direction adjacent to the drain 51 or 52, there are formed a pair of other diffusion regions (not shown) extending vertical in the drawing in correspondence to the source of the MOS transistor 53 or 57, and an aluminum strip 54 for carrying the source voltage Vcc is connected to the source region of the transistor 53 via contact holes 541-548. Similarly, an aluminum strip 59 connected to the ground pad 23 (FIG. 5) is provided in contact with the source of the transistor 57 at contact holes 591-598. In correspondence to the channel region, there is provided a polysilicon strip 55 as the gate electrode, and the gate electrode 55 is connected to the output driver 12 of FIG. 5 via a contact hole 56.

A similar layout pattern is formed also at the right edge of the chip 10' in the embodiment of FIG. 7 for the output buffer circuit of the different channel. Thus, there is provided a connection pad 22B in correspondence to the connection pad 22A such that the connection pad 22B is connected to polysilicon resistance strips 42B and 43B that correspond to the polysilicon strips 42A and 43A of the first channel, via an aluminum pattern 41B corresponding to the pattern 41A and contact holes 44B and 45B respectively corresponding to the contact holes 44A and 45A. As the rest of the construction is substantially identical with that of the first channel buffer circuit, further description will be omitted.

It should be noted that, in the layout of the second channel buffer circuit, the polysilicon resistance strips 42B and 43B extend vertically similar to the resistance strips 42A and 43A. Thus, the patterns 42B and 43B have the resistance values that are exactly identical with those of the resistance strips 42A and 43A even when there is a distortion in the pattern at the time of photolithographic process. Thereby, the output buffer circuit of the present embodiment provides a characteristic that exactly matches the industrial or other standard.

Figure 3:
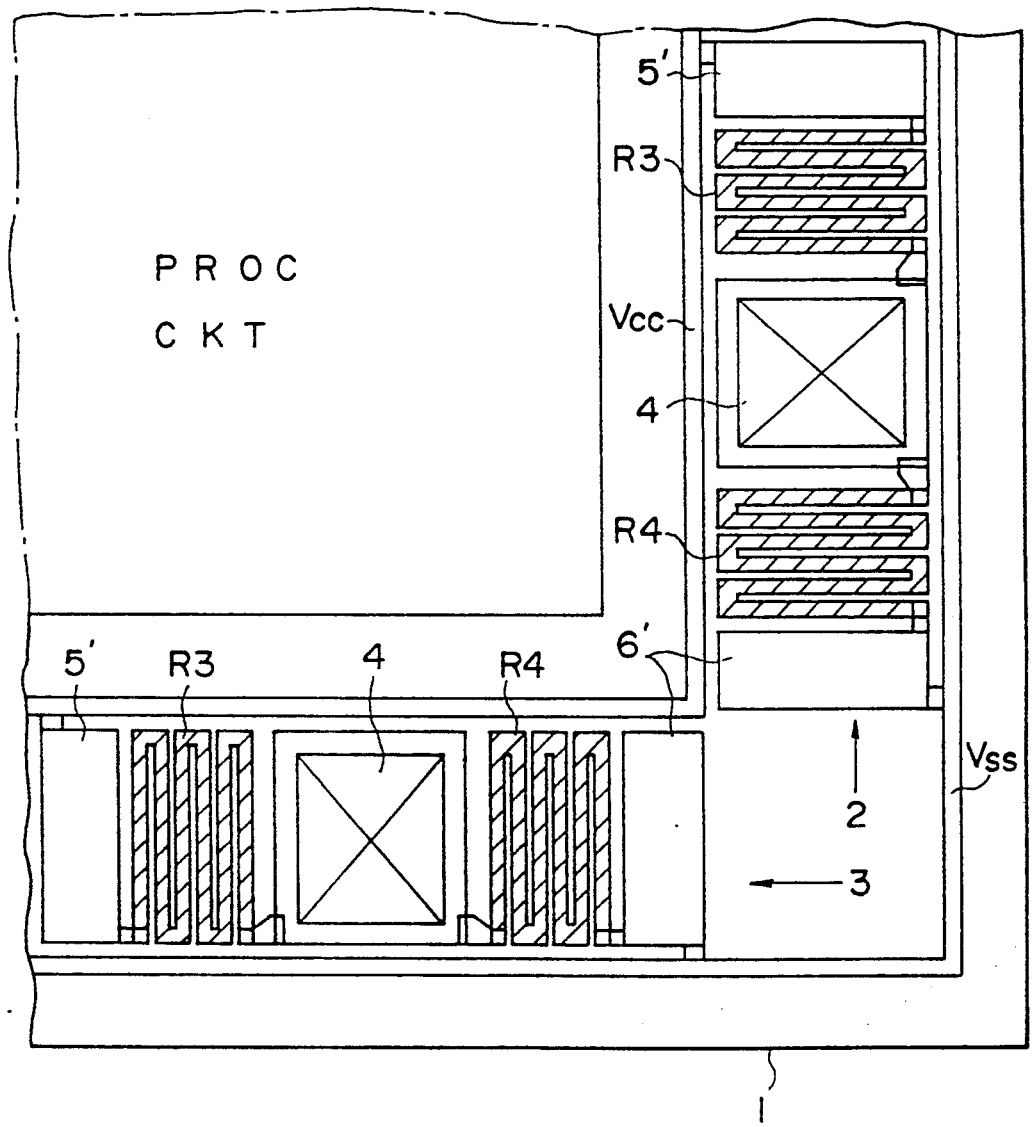
FIG. 3 is a plan view showing the layout of a conventional LSI.
Figure 4A:
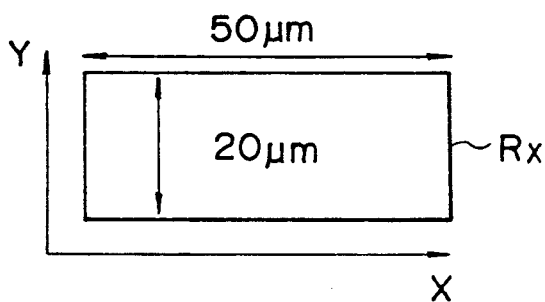
FIGS. 4(A)–4(D) are diagrams showing the problems in the conventional LSI layout.
Figure 4B:
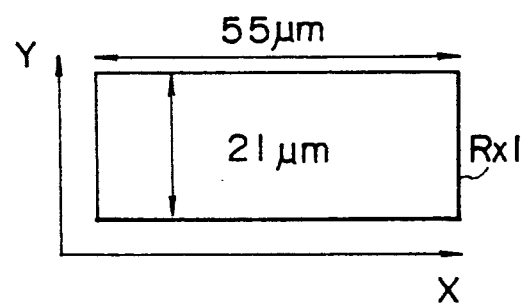
Figure 4C:
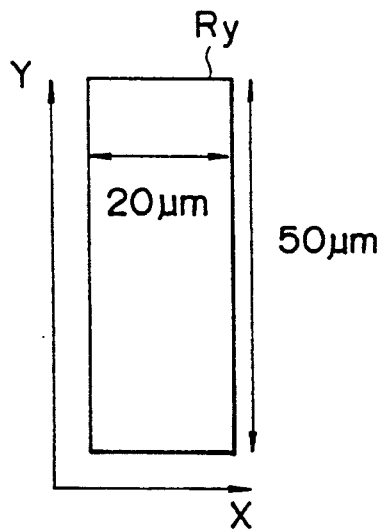
Figure 4D:
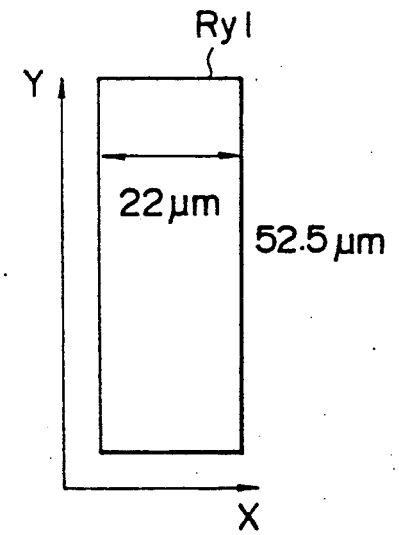
Figure 8:
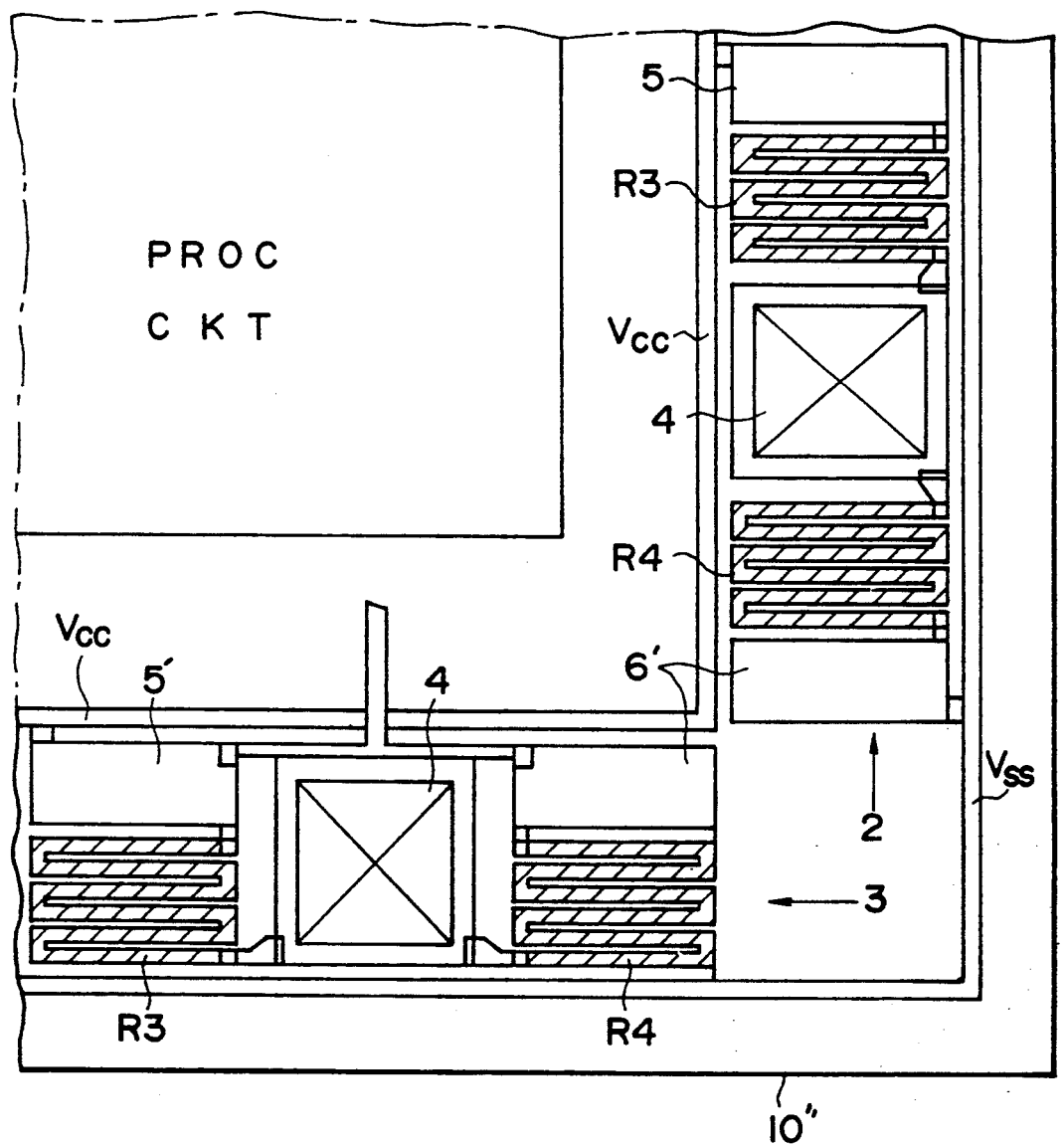
FIG. 8 is a plan view showing a third embodiment of the layout pattern.

FIG. 8 shows a still other embodiment of the output buffer circuit, wherein the feature of the present invention is shown more clearly than the second embodiment. The buffer circuit of this embodiment corresponds to the circuit of FIG. 2 and thus, the layout of FIG. 8 is similar to that of FIG. 3. Therefore, the description on the details of FIG. 8 will be omitted.

Referring to FIG. 8, it will be understood that the resistance patterns R3 and R4 have a number of resistance strips that extends in the horizontal direction irrespective of whether the resistance patterns are provided along the bottom edge of the chip 10" or along the side edge of the chip 10". Thereby, the resistance pattern R3 at the side edge of the chip 10" has a resistance value that is exactly identical with the resistance value of the resistance pattern R3 located at the bottom edge of the chip 10", even when there exists distortion in the pattern that is different in the vertical and horizontal directions. A similar result holds also in the case of the resistance pattern R4. Thus, the output buffer circuit using the pattern of FIG. 8 can successfully eliminated the problem of deviation in the output impedance.

Further, the present invention is not limited to the embodiments described heretofore, but various variations and modifications may be made without departing from the scope of the invention.

What is claimed is:

1. An integrated circuit including a plurality of circuits assembled to form a unitary body, said integrated circuit comprising:
   a circuit chip;
   one or more circuits provided on the circuit chip, for carrying out a predetermined operation;
   one of an input and output circuit provided on the circuit chip in electrical connection to said one or more circuits, said input or output circuit transmitting and/or receiving an information signal to and from an external circuit;
   a plurality of resistance areas provided in said input or output circuit for electrical connection with a plurality of conductor patterns, said plurality of resistance areas providing a predetermined input and/or output impedance of the integrated circuit; and
   a plurality of connection pads provided in the plurality of resistance areas for electrical connection therewith, said plurality of connection pads being provided for electrical connection to the external circuit and adapted therefore;
   said plurality of resistance areas including a plurality of elongated resistance strips connected in series and extending parallel with each other,
   wherein each elongated resistance strip in each resistance area extends on the circuit chip in a single direction.

2. An integrated circuit including a plurality of circuits assembled to form a unitary body, said integrated circuit comprising:
   one or more circuits provided on a circuit chip for carrying out a predetermined operation;
   an input circuit or output circuit provided on the circuit chip in electrical connection to said one or more circuits, said input or output circuit transmitting and/or receiving an information signal to and from an external circuit;
   a plurality of resistance areas provided in said input or output circuit for electrical connection with a plurality of conductor patterns, said plurality of resistance areas providing a predetermined input and/or output impedance of the integrated circuit; and
   a plurality of connection pads provided in the plurality of resistance areas for electrical connection therewith, said plurality of connection pads being provided for electrical connection to the external circuit and adapted therefore;
   said plurality of resistance areas including a plurality of elongated resistance strips connected in series and extending parallel with each other,
   said circuit chip having a lateral boundary including first and second opposing edges extending in a first direction, and third and fourth opposing edges extending in a second direction, said plurality of resistance areas including a first group of resistance areas wherein the resistance area is provided adjacent to one or both of the first and second edges and a second group of resistance areas wherein the resistance area is provided adjacent to one or both of the third and second edges.

3. An integrated circuit as claimed in claim 2 in which said plurality of resistance areas are provided along lateral boundary of the circuit chip.

4. An integrated circuit as claimed in claim 2 in which said plurality of resistance areas include a first type area including one or more resistance areas each passing the information signal, output from the input/output circuit to the conductor pattern, further to the connection pad that corresponds to the resistance area for transmission to the external circuit and a second type area including one or more resistance areas each passing the information signal, supplied from the external circuit to the connection pad, further to the input/output circuit, wherein each of the resistance areas included int eh first type area provides an identical resistance value and each of the resistance areas included in the second type area provides an identical resistance value.

5. An integrated circuit as claimed in claim 4 in which each resistance area of the first type area has a resistance pattern that is identical with each other within the first type area, and each resistance area of the second type area has a resistance pattern that is identical with each other within the second type area.

6. An integrated circuit as claimed in claim 2 wherein said elongated resistance strip in each resistance area extends on the circuit chip in a single direction.

* * * * *